US012762678B2

(12) United States Patent
Pisarenco et al.

(10) Patent No.: US 12,762,678 B2
(45) Date of Patent: Oct. 13, 2026

(54) HIDDEN DEFECT DETECTION AND EPE ESTIMATION BASED ON THE EXTRACTED 3D INFORMATION FROM E-BEAM IMAGES

(71) Applicant: ASML Netherlands B.V., Veldhoven (NL)

(72) Inventors: Maxim Pisarenco, Son en Breugel (NL); Scott Anderson Middlebrooks, Duizel (NL); Markus Gerardus Martinus Maria Van Kraaij, Eindhoven (NL); Adrianus Cornelis Matheus Koopman, Hilversum (NL)

(73) Assignee: ASML Netherlands B. V., Veldhoven (NL)

( * ) Notice: Subject to any disclaimer, the term of this patent is extended or adjusted under 35 U.S.C. 154(b) by 1515 days.

(21) Appl. No.: 17/145,033

(22) Filed: Jan. 8, 2021

(65) Prior Publication Data

US 2021/0174491 A1 Jun. 10, 2021

Related U.S. Application Data

(63) Continuation of application No. PCT/EP2019/066317, filed on Jun. 20, 2019.

(30) Foreign Application Priority Data

Jul. 10, 2018 (EP) .................................... 18182602

(51) Int. Cl.
*H01J 37/22* (2006.01)
*G03F 7/00* (2006.01)
(Continued)

(52) U.S. Cl.
CPC ............ *G06T 7/0004* (2013.01); *G03F 7/705* (2013.01); *G03F 7/70608* (2013.01); *G06T 5/50* (2013.01);
(Continued)

(58) Field of Classification Search
CPC ........... G06T 7/001; G06T 2207/10056; G06T 2207/30148; H01L 22/12; H01L 22/20; H01L 2924/0002
(Continued)

(56) References Cited

U.S. PATENT DOCUMENTS

2006/0045326 A1* 3/2006 Toyoda ................. G06T 7/0006 382/145
2006/0215901 A1* 9/2006 Nakagaki ................ G06T 7/001 382/149
(Continued)

FOREIGN PATENT DOCUMENTS

CN 1501174 A 6/2004
CN 107924119 A 4/2018
(Continued)

OTHER PUBLICATIONS

International Search Report and Written Opinion issued by the International Searching Authority in related PCT Application No. PCT/EP2019/066317, mailed Sep. 20, 2019 (4 pgs.).
(Continued)

*Primary Examiner* — Isiaka O Akanbi
(74) *Attorney, Agent, or Firm* — Finnegan, Henderson, Farabow, Garrett & Dunner LLP

(57) ABSTRACT

A method for determining the existence of a defect in a printed pattern may include obtaining a) a captured image of a printed pattern from an image capture device, and b) a simulated image of the printed pattern generated by a process model. The method may include generating a combined image as a weighted combination of portions of the
(Continued)

captured image and the simulated image. The method may include determining whether a defect exists in the printed pattern based on the combined image.

15 Claims, 17 Drawing Sheets

(51) Int. Cl.

| | |
|---|---|
| ***G06T 5/50*** | (2006.01) |
| ***G06T 7/00*** | (2017.01) |
| ***G06T 7/70*** | (2017.01) |
| ***H01J 37/28*** | (2006.01) |

(52) U.S. Cl.
CPC .............. *G06T 7/70* (2017.01); *H01J 37/222* (2013.01); *H01J 37/28* (2013.01); *G06T 2207/10061* (2013.01); *G06T 2207/20221* (2013.01); *G06T 2207/30148* (2013.01)

(58) Field of Classification Search
USPC ..................... 356/237.2–237.6; 382/141–145
See application file for complete search history.

(56) References Cited

U.S. PATENT DOCUMENTS

2011/0194752 A1* 8/2011 Pang ......................... G03F 1/84 382/149
2011/0298915 A1 12/2011 Hiroi et al.
2013/0294677 A1* 11/2013 Urano .................. G01N 21/956 382/141
2017/0010538 A1 1/2017 Hansen
2019/0346769 A1* 11/2019 Hashimoto ............ G01B 15/04

FOREIGN PATENT DOCUMENTS

TW 201640229 A 1/2016
TW 201716878 A 5/2017
WO WO 2016/202546 A1 12/2016

OTHER PUBLICATIONS

Notice of Deficiencies from the Israel Patent Office issued in related Israeli Patent Application No. 279994; mailed Dec. 21, 2022 (4 pgs.).

* cited by examiner

HIDDEN DEFECT DETECTION AND EPE ESTIMATION BASED ON THE EXTRACTED 3D INFORMATION FROM E-BEAM IMAGES

CROSS-REFERENCE TO RELATED APPLICATIONS

This application claims priority to International Application No. PCT/EP2019/066317, filed Jun. 20, 2019, and published as WO 2020/011507 A1, which claims priority of EP application 18182602.5 which was filed on Jul. 10, 2018. The contents of these applications are incorporated herein in their entireties.

TECHNICAL FIELD

The embodiments of the present disclosure relate generally to mask manufacturing and patterning processes. More particularly, the disclosure includes apparatuses, methods, and computer programs for determining three-dimensional features of a printed pattern.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g., comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device (e.g., an IC). The substrate may then undergo various processes such as etching, ion-implantation (e.g., doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm. That is, less than half the wavelength of the radiation from the illumination source (e.g., a 193 nm illumination source).

This process in which features with dimensions smaller than the classical resolution limit of a lithographic projection apparatus are printed, can be referred to as low-k1 lithography, according to the resolution formula $CD=k1\times\lambda/NA$, where is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but are not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

The embodiments of the present disclosure relate to methods, computer program products, and apparatuses for determining the existence of a defect in a printed pattern, as described below. In some embodiments, a method may include obtaining a) a captured image of a printed pattern from an image capture device, and b) a simulated image of the printed pattern generated by a process model. The method may include generating a combined image as a weighted combination of portions of the captured image and the simulated image. The method may include determining whether a defect exists in the printed pattern based on the combined image.

In some embodiments, the defect can be at least one of a hole closure, bridging, or necking in a portion of the printed pattern. The method can include determining a location or height of the defect or a defect characteristic of the defect. The determining of the defect characteristic can include determining a physical characteristic of the defect or a magnitude of the defect.

In some embodiments, the method can include calibrating the process model to reduce a probability of an occurrence of the defect. The process model can be a probabilistic lithography model configured to generate a probability field representing shapes of the printed pattern.

In some embodiments, the method can include determining an albedo distribution of the printed pattern from the probability field and incorporating the albedo distribution into a scanning electron microscope model. Accordingly, in some embodiments, the image capture device can be at least one of a scanning electron microscope or an atomic force microscope.

In some embodiments, the weighted combination can be based on a) a noise level in the captured image and b) an error level in the simulated image. A weighting of the portions of the captured image can be inversely proportional to the noise level and a weighting of the portions of the simulated image can be inversely proportional to the error level of the simulated image. The pixels in the captured image that are associated with a charging artifact can be weighted less than other pixels when generating the combined image.

In an interrelated aspect, a method for improving a process model for a patterning process may include obtaining a) a captured image of a printed pattern from an image capture device, b) a simulated image generated by the process model, and c) a combined image of the captured image and the simulated image. The method may include determining three-dimensional features of the printed pattern from the combined image and improving the process model based on the determined three-dimensional features.

In some embodiments, the captured image can be a two-dimensional image having a captured image intensity. The simulated image can be generated by a machine-learning model and the simulated image includes a simulated image intensity which is a prediction of the captured image intensity.

In some embodiments, the method can include determining a height map based on matching the simulated image intensity to the captured image intensity, the height map including the three-dimensional features. The method can include calibrating a resist model based on the height map and a predicted resist profile generated by the resist model or calculating the predicted resist profile based on parameters of the resist model. The calibration of the resist model can include determining updated parameters by at least minimizing a norm of a difference between the predicted resist profile and the height map.

In some embodiments, the height map can be calculated from the combined image using a weighted combination of portions of the captured image and the simulated image.

BRIEF DESCRIPTION OF THE DRAWINGS

Embodiments of the present disclosure and accompanying schematic drawings show aspects of the subject matter disclosed herein and, together with the description, explain some of the principles associated with the present disclosure.

DETAILED DESCRIPTION

Figure 1:
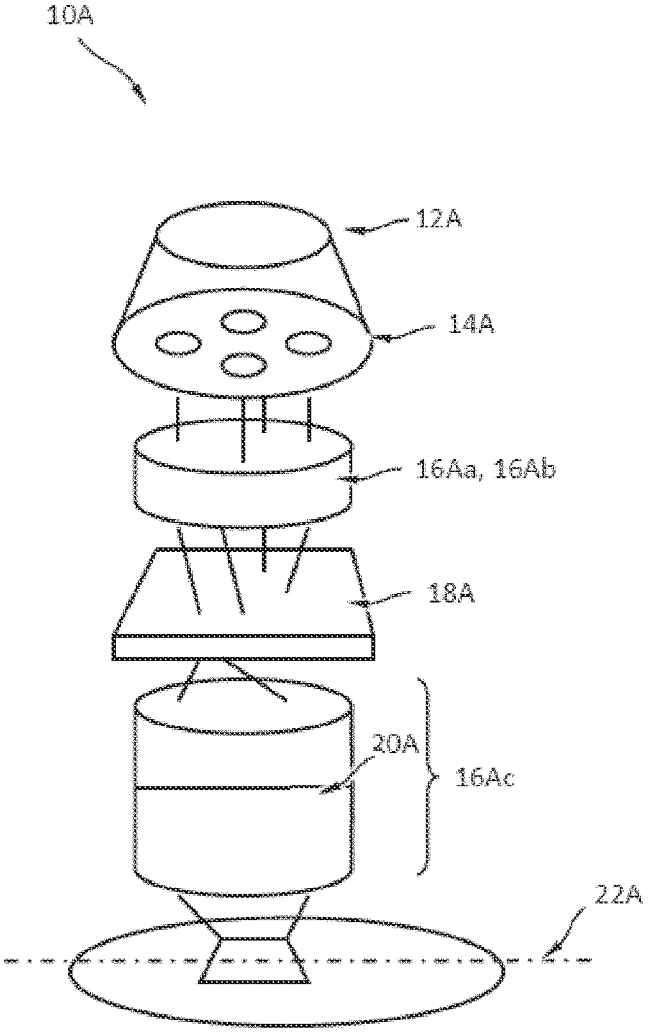
FIG. 1 illustrates a block diagram of various subsystems of a lithographic projection apparatus, according to some embodiments of the present disclosure.

Although specific reference may be made in this text to the manufacture of ICs, it should be explicitly understood that the description herein has many possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present disclosure, the terms "radiation" and "beam" are used to encompass all types of electromagnetic radiation, including ultraviolet radiation (e.g., with a wavelength of 365, 248, 193, 157 or 126 nm) and extreme ultra-violet radiation (EUV) (e.g., having a wavelength in the range of about 5-100 nm).

The patterning device can comprise, or can form, one or more design layouts. The design layout can be generated utilizing computer-aided design (CAD) programs, this process often being referred to as electronic design automation (EDA). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (e.g., transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

FIG. 1 illustrates a block diagram of various subsystems of a lithographic projection apparatus 10A, according to some embodiments of the present disclosure. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that may shape radiation from the source 12A; a patterning device 18A; and transmission optics 16Ac that may project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e., radiation) to a patterning device and projection optics may direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) may dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), may apply OPC using those techniques and models and evaluate performance (e.g., in terms of process window) and are described in U.S. Patent Application Publication Nos. US 2008-0301620, 2007-0050749, 2007-0031745, 2008-

0309897, 2010-0162197, and 2010-0180251, the disclosures of each are hereby incorporated by reference in their entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In some embodiments, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to some embodiments of the present disclosure, one or more images may be generated. The images may include various types of signals that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In some embodiments, the threshold value may be fixed (e.g., a midpoint of a highest intensity and a lowest intensity of pixel within the image). In some embodiments, a strong signal may refer to a signal with values greater than or equal to an average signal value across the image and a weak signal may refer to signal with values less than the average signal value. In some embodiments, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to some embodiments, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
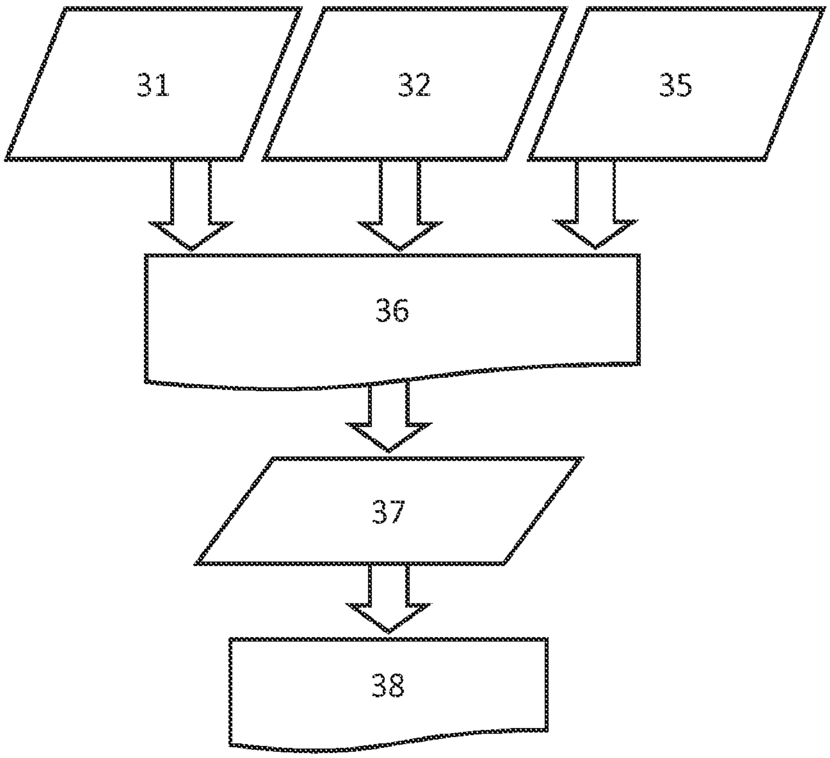
FIG. 2 illustrates an exemplary flow chart for simulating lithography in a lithographic projection apparatus, according to some embodiments of the present disclosure.

FIG. 2 illustrates an exemplary flow chart for simulating lithography in a lithographic projection apparatus, according to some embodiments of the present disclosure. Source model 31 may represent optical characteristics (including radiation intensity distribution and/or phase distribution) of the source. Projection optics model 32 may represent optical characteristics (including changes to the radiation intensity distribution and/or the phase distribution caused by the projection optics) of the projection optics. Design layout model 35 may represent optical characteristics of a design layout (including changes to the radiation intensity distribution and/or the phase distribution caused by design layout 33), which may be the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but are not limited to, numerical aperture settings, illumination sigma (G) settings as well as any particular illumination shape (e.g., off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can be compared against an intended design. The intended design is generally defined as a pre-OPC design layout which can be provided in a standardized digital file format such as GDSII or OASIS or other file format.

From this design layout, one or more portions may be identified, which are referred to as "clips". In some embodiments, a set of clips may be extracted, which may represent the complicated patterns in the design layout (e.g., typically about 50 to 1000 clips, although any number of clips may be used). These patterns or clips may represent small portions (e.g., circuits, cells or patterns) of the design and more specifically, the clips may typically represent small portions for which particular attention and/or verification may be needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (e.g., such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In some embodiments, the design variables $(z_1, z_2, \ldots, z_N)$ may comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$). The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In some embodiments, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. A slower resist (e.g., a resist that requires higher amount of radiation to be properly exposed) may lead to lower throughput.

As used herein, the term "patterning process" may mean a process that creates an etched substrate by the application of specified patterns of light as part of a lithography process.

As used herein, the term "target pattern" may mean an idealized pattern that can be etched on a substrate.

As used herein, the term "printed pattern" may mean the physical pattern on a substrate that was etched based on a target pattern. The printed pattern can include, for example, troughs, channels, depressions, edges, or other two- and three-dimensional features resulting from a lithography process.

As used herein, the term "process model" may mean a model that includes one or more models that simulate a patterning process. For example, a process model can include any combination of: an optical model (e.g., that models a lens system/projection system used to deliver light in a lithography process and may include modelling the final optical image of light that goes onto a photoresist), a resist model (e.g., that models physical effects of the resist, such as chemical effects due to the light), an OPC model (e.g., that can be used to make target patterns and may include sub-resolution resist features (SRAFs), etc.), an image capture device model (e.g., that models what an image capture device may image from a printed pattern).

As used herein, the term "image capture device" may mean any number or combination of devices and associated computer hardware and software that can be configured to generate images of a target, such as the printed pattern or portions thereof. Non-limiting examples of an image capture devices can include: electron beam inspection apparatuses, scanning electron microscopes (SEMs), x-ray machines, atomic force microscopes, etc.

As used herein, the term "calibrating" may mean to modify (e.g., improve or tune) and/or validate an apparatus or computer program, such as the process model.

Figure 3:
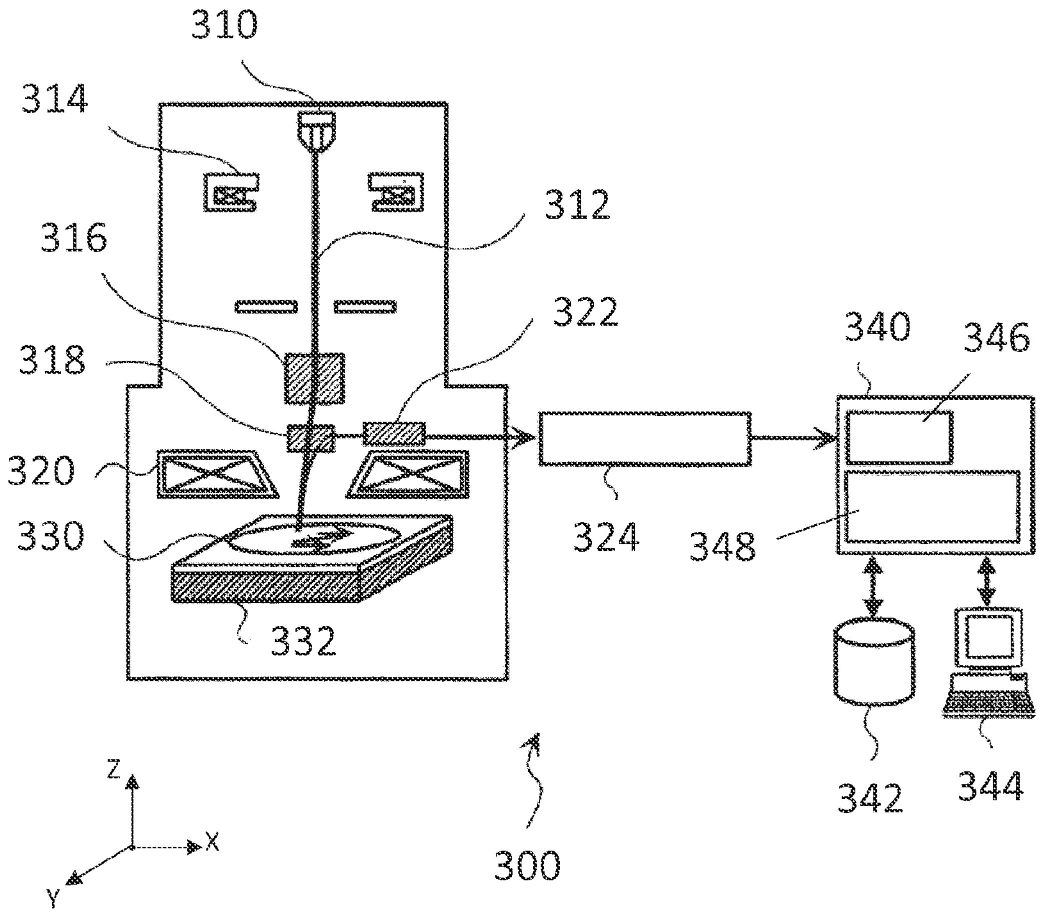
FIG. 3 is a diagram illustrating an exemplary scanning electron microscope, according to some embodiments of the present disclosure.

FIG. 3 is a diagram illustrating an exemplary scanning electron microscope, in accordance with some embodiments of the present disclosure.

Measurement information of fabricated structures (e.g., wafers) can be used for process modeling, existing model calibration (including recalibration), defect detection, estimation, characterization or classification, yield estimation, process control or monitoring, etc.

As noted above, in patterning processes, process control and verification can include frequent measurements of the structures. One or more parameters a structure can be measured or determined, for example, a critical dimension, the overlay error between successive layers formed in or on the substrate, etc. There are various techniques for making measurements of the microscopic structures formed in a patterning process. Various tools for making such measurements can include, scanning electron microscopes (SEMs), which can be used to measure a parameter, such as critical dimension ("CD") and/or edge point ("EP"). SEMs can be capable of resolving features of the order of 30 nm or less, 20 nm or less, 10 nm or less, or 5 nm or less.

FIG. 3 schematically depicts an embodiment of an electron beam inspection apparatus 300. In some embodiments, primary electron beam 312 emitted from electron source 310 can be converged by condenser lens 314 and then may pass through beam deflector 316, E×B deflector 318, and objective lens 320 to irradiate substrate 330 on substrate table 332 at a focus.

When substrate 330 is irradiated with electron beam 312, secondary electrons are generated from substrate 330. The secondary electrons can be deflected by E×B deflector 318 and detected by secondary electron detector 322. A two-dimensional electron beam image can be obtained by detecting the electrons generated from the sample in synchronization with, for example, two-dimensional scanning of the electron beam by beam deflector 316. In another embodiment, the two-dimensional electron beam image can be obtained with repetitive scanning of electron beam 312 by beam deflector 204 in an X or Y direction, together with continuous movement of substrate 330 by substrate table 332 in the other of the X or Y direction. Thus, in some embodiments, electron beam inspection apparatus 300 has a field of view for electron beam 312 defined by the angular range into which electron beam 312 can be provided by the electron beam inspection apparatus 300 (e.g., the angular range through which the deflector 316 can provide electron beam 312). Thus, the spatial extent of the field of the view is the spatial extent to which the angular range of electron beam 312 can impinge on a surface.

A signal detected by secondary electron detector 322 can be converted to a digital signal by analog/digital (A/D) converter 324, and the digital signal can be sent to image processing system 340. In some embodiments, image processing system 340 may have memory 346 to store all or part of digital images for processing by processing unit 348. Processing unit 348 (e.g., specially designed hardware or a combination of hardware and software or a computer readable medium comprising software) may be configured to convert or process the digital images into datasets representative of the digital images. In some embodiments, processing unit 348 can be configured or programmed to cause execution of a method described herein. Further, image processing system 340 may have a non-transitory storage medium 342 configured to store the digital images and corresponding datasets in a reference database. Display device 344 may be connected with the image processing system 340, so that an operator can conduct operation of the equipment with the help of a graphical user interface.

Figure 4:
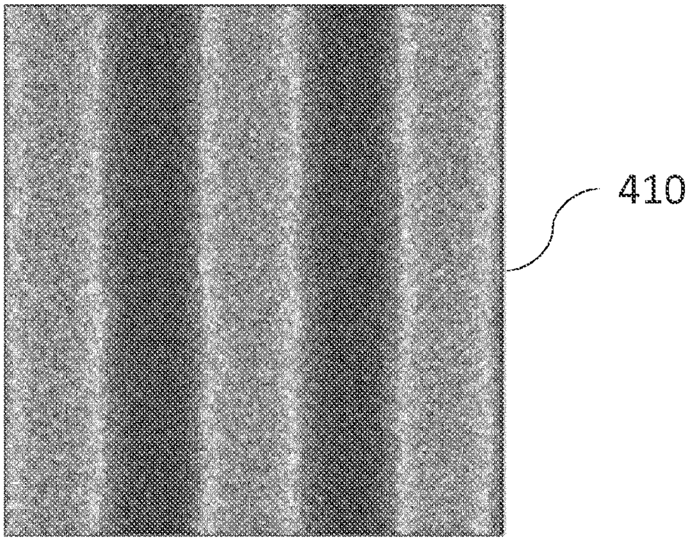
FIG. 4 illustrates an exemplary SEM image and an exemplary reconstructed SEM image, according to some embodiments of the present disclosure.
Figure 4:
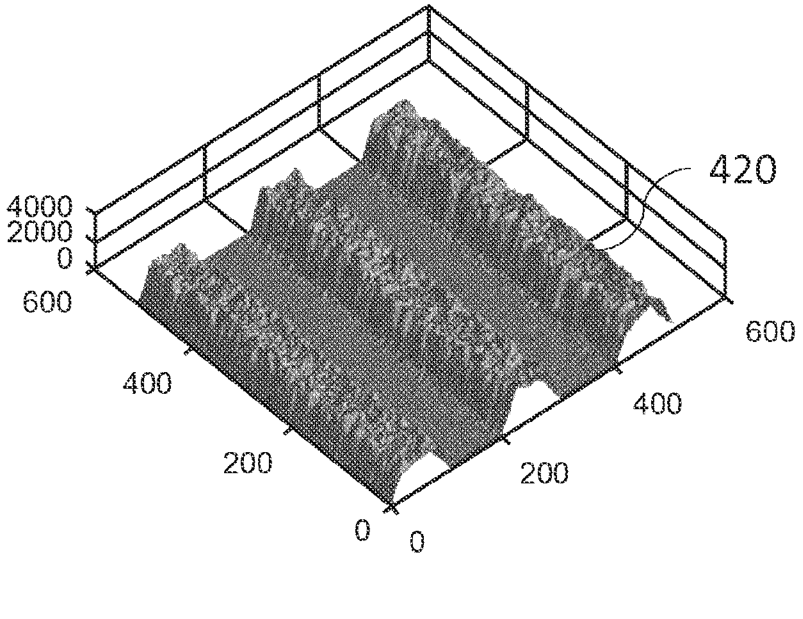

FIG. 4 illustrates an exemplary SEM image 410 and an exemplary reconstructed SEM image, according to some embodiments of the present disclosure.

Manufacturing processes of printed patterns may involve etching three-dimensional features (e.g., channels, holes, etc.) into a substrate to form a printed pattern. Such printed patterns can be imaged to determine three-dimensional features as part of, for example, verification of manufacturing techniques or validation of process simulations. Image capture devices, such as a SEM, can generate a two-dimensional captured image 410 (e.g., a pixel map) of the printed pattern. While many factors can influence the measured intensity of the SEM signal, a primary factor can be the height and angle of the surface of the printed pattern. In FIG. 4, captured image 410 contains alternating bands of generally light and dark pixels. Reconstructed image 420 (bottom) is a three-dimensional reconstruction of the printed pattern, shown in perspective to illustrate that the three-dimensional features of the printed pattern, which can include alternating ridges. Accordingly, the SEM image intensity is proportional to the height, with the brighter pixels corresponding to the raised sections of the printed pattern.

Figure 5:
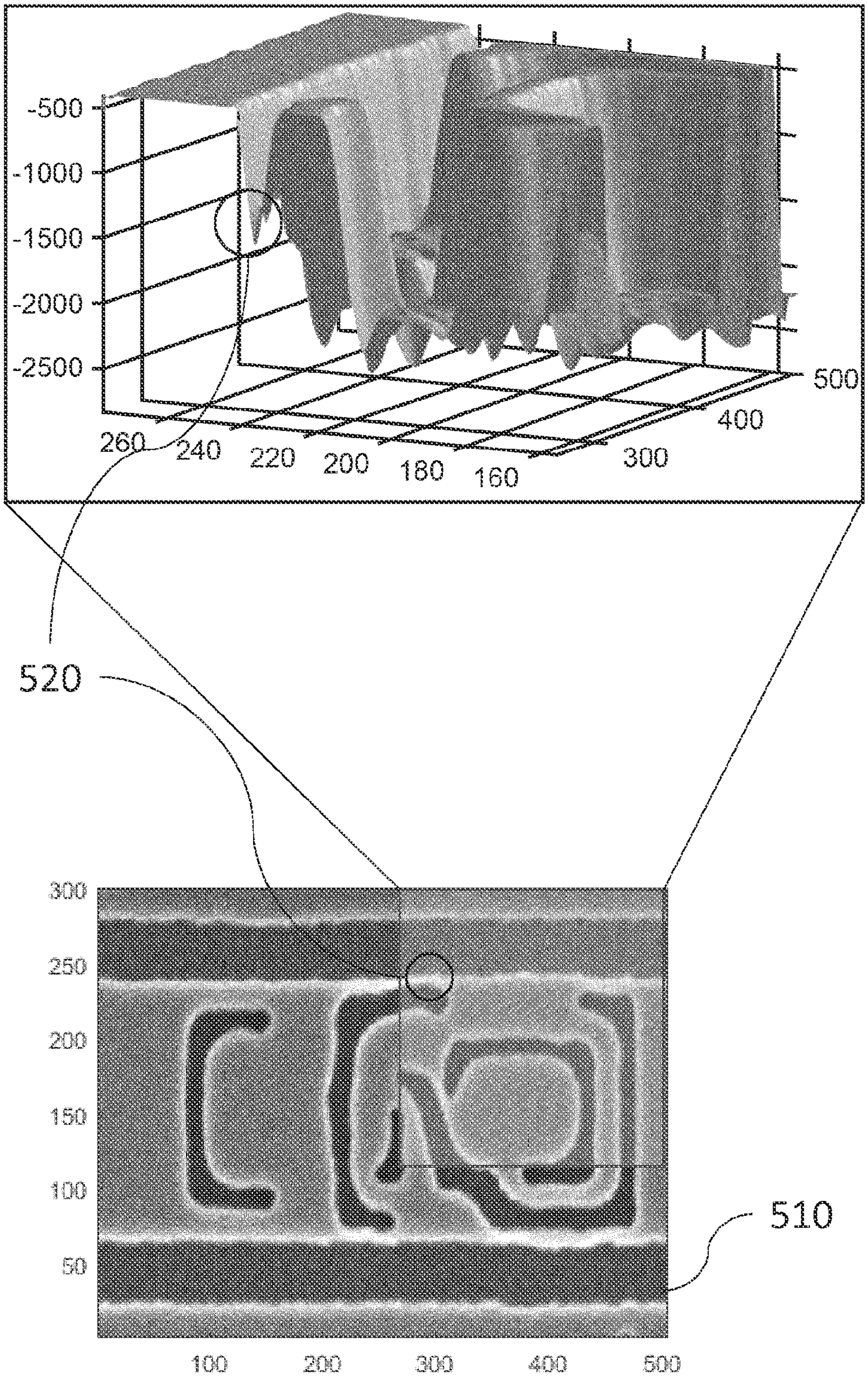
FIG. 5 illustrates detection of an exemplary hidden defect in a printed pattern, according to some embodiments of the present disclosure.

FIG. 5 illustrates detection of an exemplary hidden defect in a printed pattern, according to some embodiments of the present disclosure.

As previously discussed, a SEM image can reflect three-dimensional features of a printed pattern. However, some limitations of the image capture device, such as limited depth resolution, can cause some features below the scanning surface to be hidden. One example is shown in FIG. 5 where SEM image 510 (bottom) shows a number of raised features (corresponding to the darker pixels) separated by channels (corresponding to the lighter pixels). The lightest pixels correspond to edges of the raised features. Referring to the circled area, based on SEM image 510, it appears that there is a channel between the adjacent raised features, as intended according to a target pattern. However, a three-dimensional reconstruction, shown by the expanded view of a portion of SEM image 510, indicates that there is actually a defect 520 in the printed pattern that was not shown in SEM image 510. Here, the defect 520 is a bridging defect where the adjacent raised areas meet below the surface instead of forming the desired channel suggested by SEM image 510.

As described above, three dimensional features can be reconstructed from SEM images. However, in cases where captured images are noisy or suffer from artifacts, such reconstructions can be unreliable. As described in further detail below, unreliable areas in the captured images can be supplemented with simulated images (e.g., generated by a SEM model). Accordingly, embodiments of methods described herein for determining the existence of a defect in a printed pattern can include obtaining a) a captured image of a printed pattern with the image capture device, and b) a simulated image of the printed pattern generated by a process model. As described in further detail herein, this can also include generating a combined image as a weighted combination of portions of the captured image and the simulated image. As used herein, "portions" can include any subset of an image (or the entire image) and accordingly can include any number or distribution of pixels from the image. In an embodiment, this can similarly be considered a merging operation where the combined image is constructed or assembled based on a merging of weighted corresponding pixels from the captured image and the simulated image.

Based on the combined image, it can be determined whether a defect in the printed pattern exists. In addition to determining whether a defect exists, a location and/or height of the defect can also be determined. Defects can be detected and/or determined by computing a difference between an intended design (e.g., the target pattern, which can be three-dimensional) and the reconstructed three-dimensional shape (e.g., a height map generated from the combined image). When the difference is larger than a predefined threshold, this can be flagged as a defect. Details of the height map and combined image are described in further detail with reference to FIG. 7. When defects have been identified, the process model can be calibrated to reduce a probability of an occurrence of the defect.

As used herein, "defect" may mean any physical feature or characteristic in the printed pattern that was not intended based on the patterning process. Defects can include, for example, hole closure, bridging, or necking in a portion of printed pattern.

Similarly, some embodiments can include determining defect characteristics of the defect such as physical characteristics, magnitude, optical characteristics, etc. Examples of physical characteristics can include, for example, roughness, deviations from an intended shape (e.g., hole closure), slope, curvature, recesses, protrusions, or other features that can be derived from the three-dimensional shape of the printed pattern. In contrast, optical characteristics can include, for example, albedo or discoloration resulting from the patterning process. Such characteristics can have a magnitude associated with them, such as a degree of roughness, height of protrusion, change in albedo, etc.

Before discussing embodiments that aid in determining whether defects exist in the printed pattern, we first describe embodiments where simulated images are generated. When performing simulations of SEM images, a number of lithography models or their sub-components (e.g., optical, etch, resist, etc.) can be used to predict the printed pattern and thus the basis of the simulated SEM image. In some embodiments, the process model can be a probabilistic lithography model configured to generate a probability field representing shapes in the printed pattern. One example of a probabilistic lithography model is described in PCT/EP2015076582, the contents of which are incorporated by reference, and in particular, the discussion referred to by FIG. 6 of PCT/EP2015076582, of the model that predicts a resulting pattern (e.g., post-development, post-etch, etc.) from a design pattern used in a patterning process.

As part of the probabilistic lithography model, a probability field P(x, y) can be computed that is the probability of the creation (or not) of a portion of the structure. In some embodiments, the probability may be the probability of development, or no development, of a portion of a resist subsequent to development of the resist as part of a patterning process. In some embodiments, the probability may be the probability of post-etch formation, or no post-etch formation, of a portion of a substrate after etch using a patterned resist as part of a patterning process. This can refer to a post-development resist model but the probabilistic lithography model can be used to model other parts of the patterning process, such as a post-etch model.

It has been discovered that a logistic model/function can be used to accurately predict the response in parts (e.g., pixels) of an image of a physical structure produced using a patterning process. Thus, in some embodiments, the aerial image can be transformed to a probability field in the form of a logistic model. For example, the logistic model can represent a post-development resist model or a post-etch model. In some embodiments, the logistic model can be any logistic function having any number of features/regressors and any number of parameters. In some embodiments, in the context of a resist model, the aerial image is projected to a logistic model comprising a sigmoid function in the form of, for example:

$$P(x, y) = \frac{1}{1 + e^{-\gamma(a(x,y)-\tau)}} \tag{3}$$

wherein P(x, y) is the probability of developing, or not developing, the resist, a(x, y) is the aerial image as described above, $\gamma$ determines the slope of the sigmoid and is proportional to resist sensitivity, and $\tau$ is the threshold that determines the a for which P=0.5 (equal probability of being developed or not developed). Thus, in some embodiments, the probability $P\in[0,1]$. In this example, the maximum value of the logistic model is 1, in which case $\tau$ is the threshold that determines the a for which P is half of that maximum value.

As discussed above, SEM image intensity can be related to the shape (or probable shape) of the printed pattern. One aspect that affects SEM image intensity is the albedo of the printed pattern. Albedo is a material property and can be defined as the SEM intensity corresponding to a particular material for a perfectly horizontal surface. Some embodiments can include determining an albedo distribution of the printed pattern from the probability field generated by the lithography model. The albedo distribution can then be incorporated into an SEM model when generating simulated SEM images.

Figure 6:
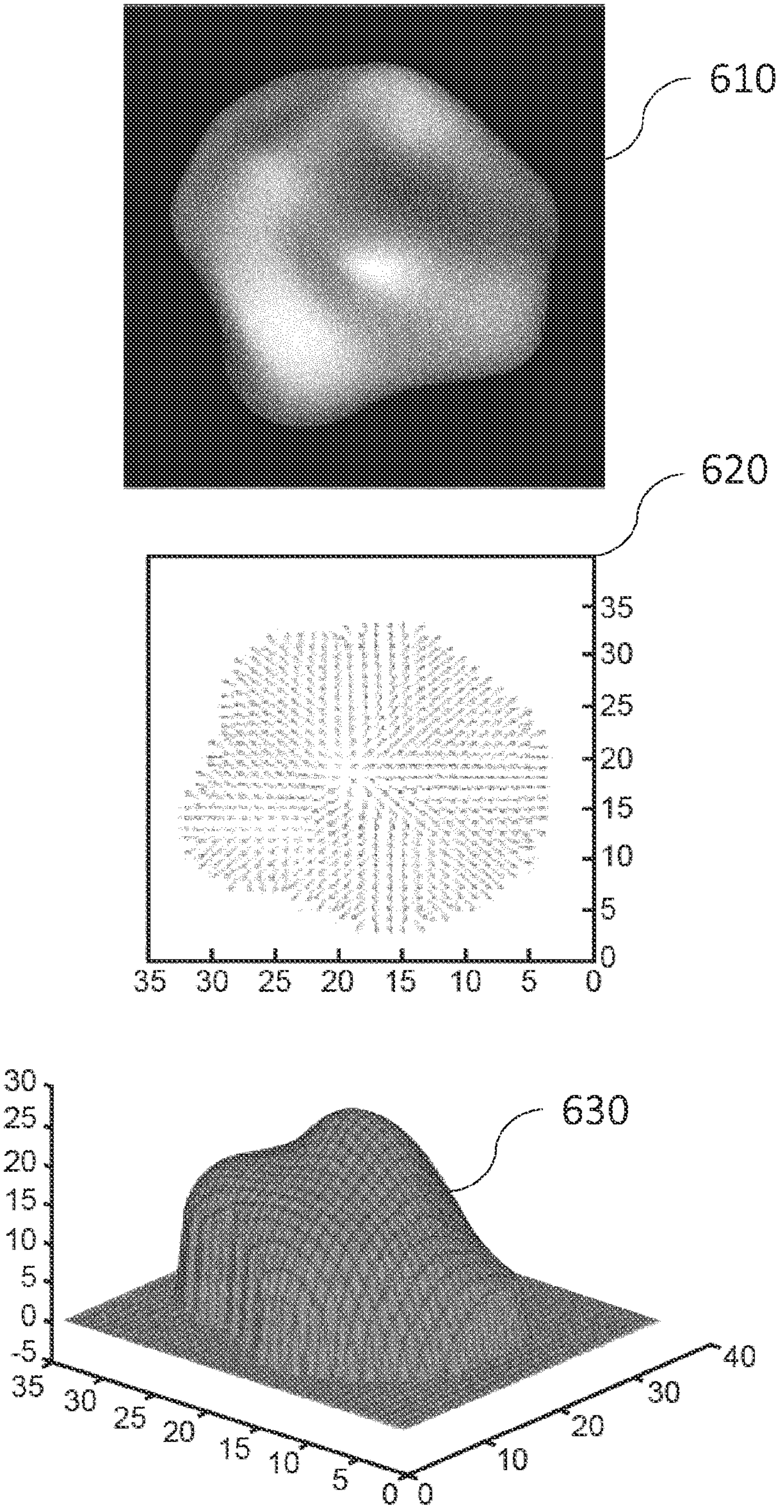
FIG. 6 illustrates an exemplary height map formed from a captured image, according to some embodiments of the present disclosure.

FIG. 6 illustrates an exemplary height map 630 formed from a captured image 610, according to some embodiments of the present disclosure.

Captured image 610, such as one acquired from a scanning electron microscope, is shown in the top portion of FIG. 6. As shown in the middle portion of FIG. 6, a normal vector field 620 can be determined from captured image 610 and is shown represented by a collection of normal vectors that define a surface. As shown in the bottom portion of FIG. 6, height map 630 (showing a height relative to a reference plane) can be determined from the normal vector field 620.

In some embodiments, height map 630 can be calculated based on an SEM model of the following form:

$$R(n(x, y)) = \frac{v(x, y)}{\cos(\phi(s, n))} = \frac{v(x, y)}{s \cdot n(x, y)} = \frac{v\sqrt{|\nabla z|^2 + 1}}{-s_x z_x - s_y z_y + s_z}$$

In the above, R is the modeled SEM image. It can be expressed in terms of v being the albedo and $\phi$ being the angle between vector n (the normal direction to the surface) and s (the unit vector, or Cartesian components $s_x$, $s_y$, and $s_z$ thereof, of the direction of illumination). The height at location (x, y) is given by z, with $\nabla z$ being the gradient of the height, and $z_x$, $z_y$, being x and y derivatives of z, respectively. At normal incidence, such an SEM model reduces to $$R(n(x, y)) = v\sqrt{|\nabla z|^2 + 1}$$

Rearranging the above, the equation can allow for the solution of z (the height map):

$$|\nabla z| = \sqrt{\frac{f^2}{v^2} - 1}$$

Here, f is the modeled SEM image, previously referred to as R. This equation is the eikonal equation and can be solved by implementing a fast marching method.

Other, more complex SEM models can be used to determine the height map, for example multi-scale single kernel (Jones 1993), multi-scale multi-kernel (Seeger 2004, Seegers 2005), and various Monte-Carlo approaches (eScatter, Casino, Monsel, etc.).

Figure 7:
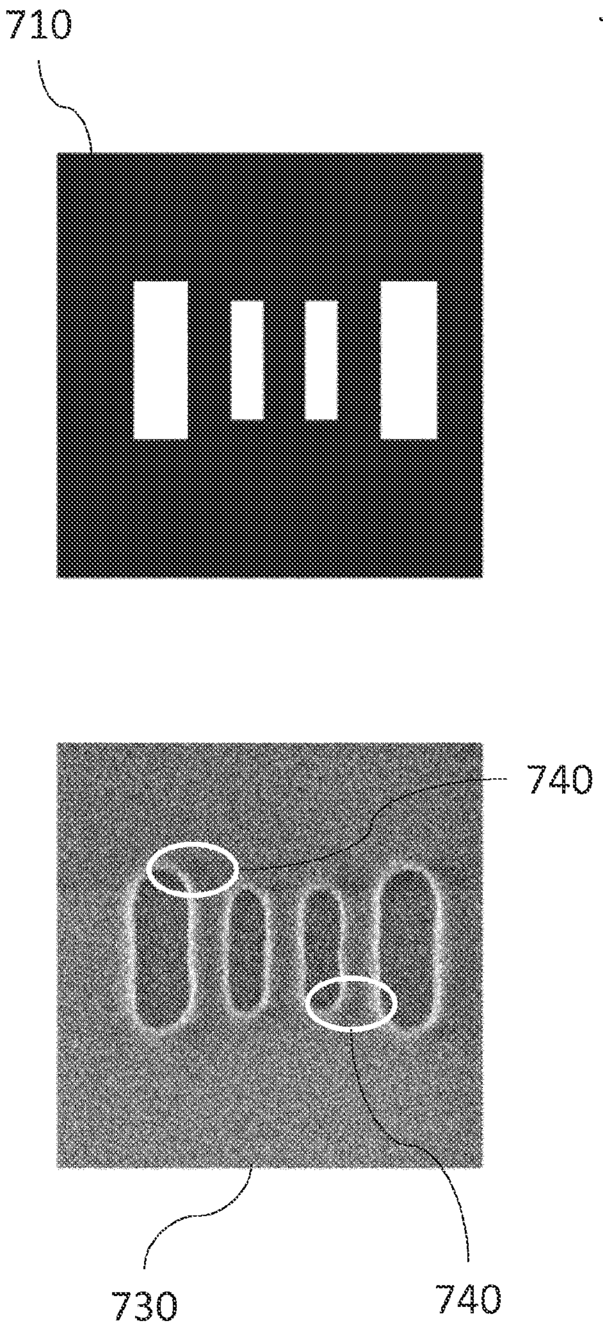
FIG. 7 illustrates an example of a charging artifact in a scanning electron microscope image, according to some embodiments of the present disclosure.

FIG. 7 illustrates an example of generating a combined image to correct an artifact in a scanning electron microscope image, according to some embodiments of the present disclosure.

In FIG. 7, exemplary pattern 710 (e.g., a mask) is shown as having four areas which correspond to holes or depressions in a printed pattern. Based on pattern 710, simulated image 720 can be generated that predicts what the image capture device signal would be. In some embodiments, given a mask or pattern, and the scanning direction of the image capture device, regions of the captured image that contain artifacts can be determined (or optionally predicted prior to image capture). An example captured image 730 is also shown, which includes artifacts 740, shown by the dark horizontal streaks. As described further below, combined image 750 (that does not contain artifacts 740) can be generated from simulated image 720 and captured image 730.

Embodiments consistent with present disclosure can allow for the reduction or elimination of artifacts or other lower quality regions of a captured image. The reduction of such artifacts can allow for a more accurate three-dimensional reconstruction of a printed pattern and thereby improve the ability to detect hidden defects that may result from the patterning process.

One example of an artifact that can be reduced or eliminated is a charging artifact. A charging artifact can occur when the area being scanned by a SEM does not conduct electrons (from the SEM electron beam) as it should, which can result in a buildup of charge on the surface (or inside the material). Such charged areas can provide an incorrect image because backscattered electrons can be accelerated (e.g., by a surface potential due to the charge buildup) and as such provide an incorrect image intensity.

Specifically, in some embodiments, captured image 730 and simulated image 720 can be merged to form combined image 750 that is more accurate than either of two images individually. Accordingly, a more accurate height map can be generated from the combined image. The weighted combination can be based on a noise level in captured image 730, an error level in simulated image 720, etc. Noise level can include electronic noise, statistical noise, or the like, that may be present in captured images 730. Similarly, simulated pixel intensities can have an uncertainty (or error level) associated with them as determined by the process model. At pixels where the captured image 730 is noisy, simulated image 720 can be used to replace the noisy pixels and provide an improved combined image. Similarly, portions of simulated image 720 which have an increased error level can be replaced by lower-noise pixels from captured image 730. In particular, according to an embodiment, a weighting of captured image 730 can be inversely proportional to the noise level and a weighting of simulated image 720 can be inversely proportional to the error level of simulated image 720.

Accordingly, some embodiments can include having pixels in captured image 730 that are associated with charging artifact 740 weighted less than other pixels when generating combined image 750.

In some embodiments, captured image 730 can be analyzed to determine a likelihood of a given pixel being an artifact. For example, by comparing a similar, or previously acquired, captured image without artifacts to another captured image that may contain artifacts, regions that may correspond to an artifact can be identified. This can include discriminating between previously identified dark areas (that are known not to be artifacts) and dark areas that were not previously identified. In this way, dark pixels in a captured image can be excluded if they are known beforehand as not being artifacts.

In addition to improving captured images, as described above, some embodiments of the present disclosure may also provide for methods and systems for improving a process model for a patterning process. The method can include obtaining a captured image of a printed pattern from an image capture device, a simulated image generated by the process model, and a combined image of the captured image and the simulated image. Three-dimensional features of the printed pattern can be determined from the combined image. The process model can be improved based on the determined three-dimensional features, as discussed in greater detail below.

As used herein, "three-dimensional features" can include, for example, a surface, depression, interior space, holes, protrusions, of some or all of a printed pattern or a simulated two-dimensional image.

In some embodiments, the captured image can be a two-dimensional image having a captured image intensity. The captured image intensity can be the intensity of the captured image on a pixel-by-pixel basis.

In some embodiments, the simulated image can be generated by a machine-learning model. The simulated image can have a simulated image intensity that can be a prediction of the captured image intensity. The machine-learning model, can include, for example, the embodiment described with reference to FIGS. 10-11.

In some embodiments, three-dimensional features can be represented by a height map that is representative of height of a printed pattern relative to some reference point (e.g., a table surface upon which the printed pattern rest). The height map can be based on matching the simulated image intensity to the captured image intensity. Matching can include any combination of, for example, translating, rotating, scaling, and similar transformations, of the height map (or portions thereof) to improve the agreement between the measured image and the simulated image.

Accordingly, the height map can include the three-dimensional features, which can permit further improvements to the process model or the manufacturing process, as discussed further below.

Figure 8A:
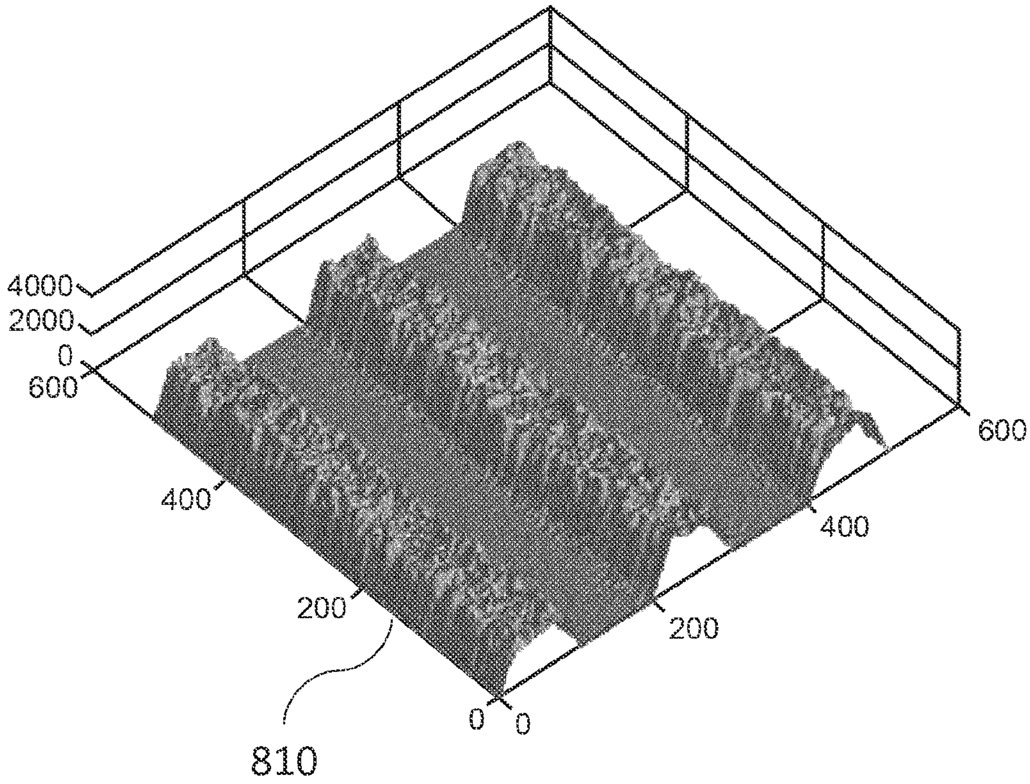
FIG. 8A illustrates an exemplary determination of roughness from a height map, according to some embodiments of the present disclosure.
Figure 8A:
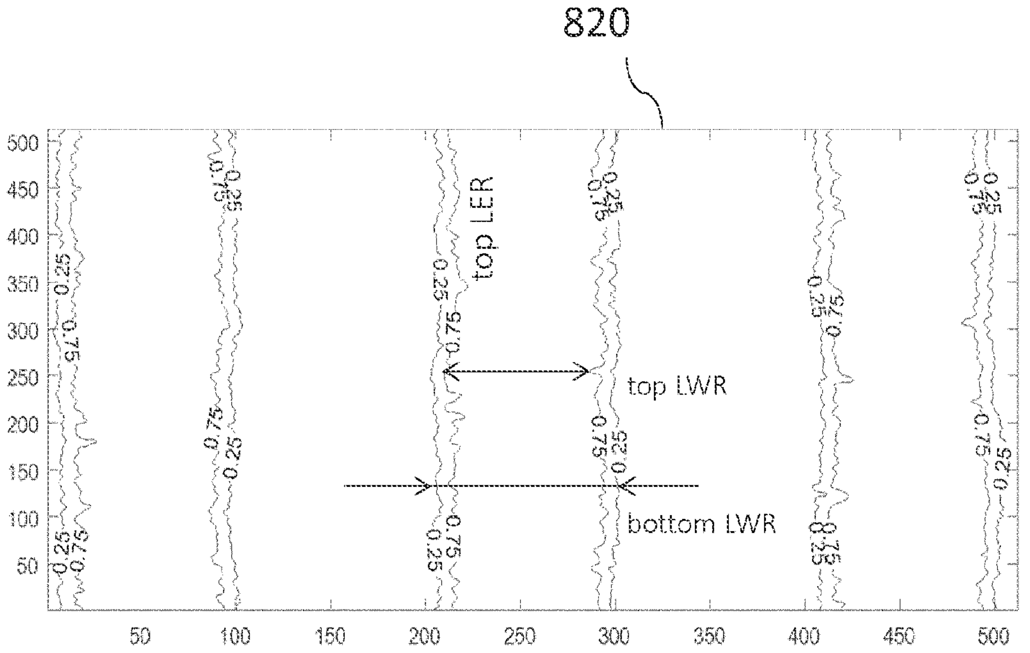

FIG. 8A illustrates an exemplary determination of roughness from a height map, according to some embodiments of the present disclosure.

As described herein, based on previously determined height map, features of the printed pattern can be determined that can be used to improve the process model. In some embodiments, roughness can be determined at a location below a surface of the height map. The top illustration in FIG. 8A shows an exemplary height map 810 of a line space pattern (as previously shown in FIG. 4). The bottom image 820 illustrates contours at 25% and 75% of a nominal height. Based on these contours, various metrics can be derived, for example, a line width roughness and a line edge roughness. The line width roughness (LWR) can be a measure of the roughness across a specified width, for example, the width of the elevated line at a particular height, as shown by the horizontal arrows. Similarly, the line edge roughness (LER) can be a measure of the roughness along a specified edge, for example, the edge of the elevated line at a particular height. In this example, the line edge roughness can be calculated along the contour shown in the vertical direction in the bottom illustration of FIG. 8A.

Edge placement error (EPE) can be considered the difference between a target pattern and the actual physical shape realized by the printed pattern, and can be a function of the roughness of the printed pattern. Because roughness can be different at different heights, some of the embodiments described herein can incorporate three-dimensional information from height map to determine height-dependent roughness.

In some embodiments, the above calculated roughness can be used to determine an edge placement error at a location below the surface of the height map. One example calculation of EPE is given by:

$$EPE = \mu_{EPE} + 3\sigma_{EPE} = \frac{HR_{OPC}}{2} + \frac{3\sigma_{PBA}}{2} + \frac{6\sigma_{LWR}}{\sqrt{2}} + \sqrt{(3\sigma_{overlay})^2 + \left(\frac{3\sigma_{CDU}}{2}\right)^2}$$

Here, $\mu_{EPE}$ is the mean EPE, $\sigma_{EPE}$ is the standard deviation of the EPE. The expanded equation contains $HR_{OPC}$, which is a half-range of resist CD error at process target conditions due to OPC residuals, $\sigma_{PBA}$ is the standard deviation of proximity bias average, also expressed as the largest tool-tool variation of field-average CD by feature, $\sigma_{overlay}$ is the standard deviation of an overlay, and $\sigma_{CDU}$ is CD uniformity.

Accordingly, optimization of the process model can result in reducing a roughness that has been measured from the height map, and thereby reducing the EPE.

Figure 8B:
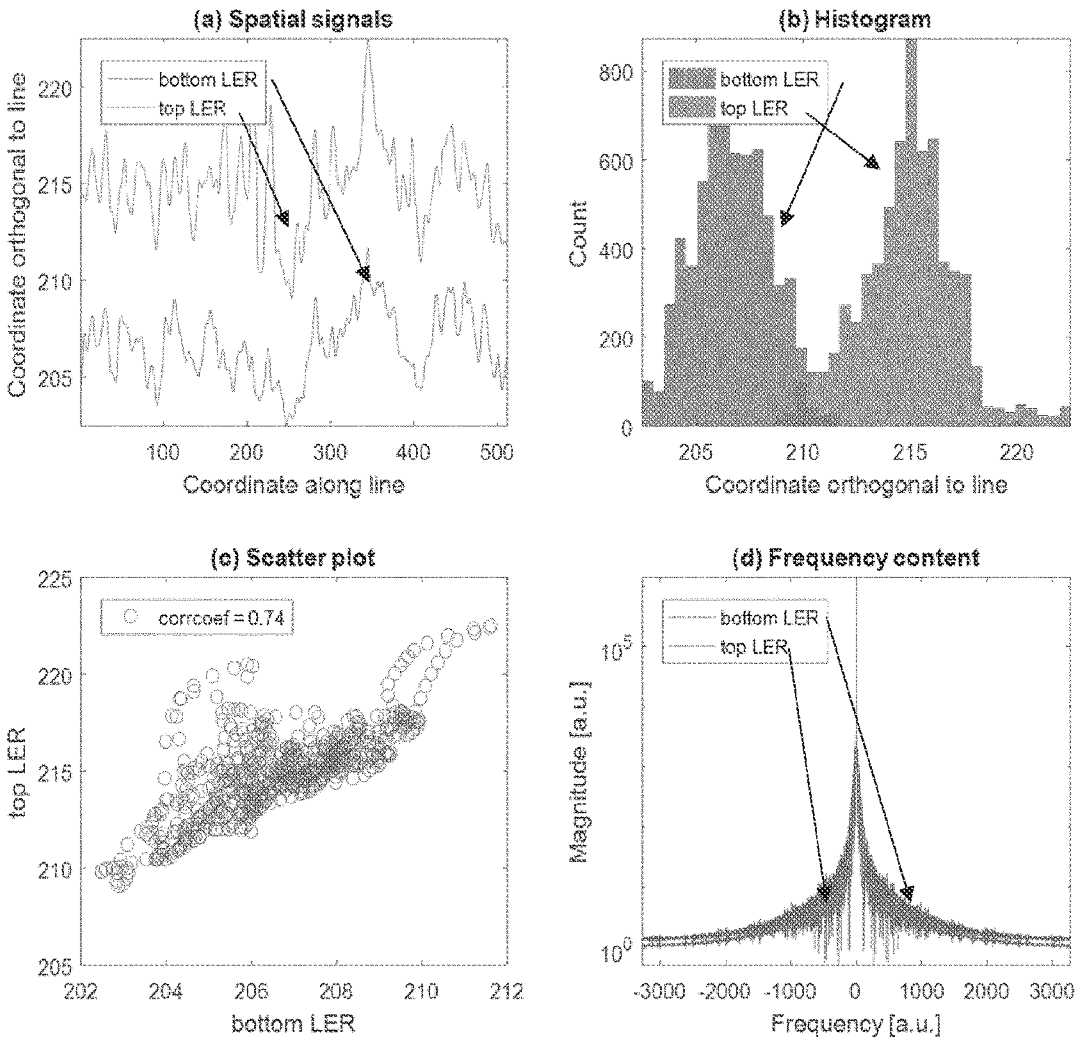
FIG. 8B illustrates exemplary statistics that can be derived from the height map, according to some embodiments of the present disclosure.

FIG. 8B illustrates exemplary statistics that can be derived from the height map, according to some embodiments of the present disclosure.

From height map, a number of statistics can be determined that can provide useful information on the printed pattern, or used to adjust or otherwise improve the process model. FIG. 8B(a) is an expanded view of two of the contours shown in FIG. 8A. The top contour (labelled "top LER") illustrates the line edge roughness at the top (or more precisely at 75% of the nominal height of the line space pattern) of the contour extending vertically at around 205 on the X-axis of FIG. 8A. Similarly, the bottom contour ("top LER") illustrates the line edge roughness at the bottom (or more precisely at 25% of the nominal height of the line space pattern) of the contour extending vertically at around 215 on the X-axis of FIG. 8A. FIG. 8B(b) illustrates that the top LER can have a broader distribution. That is, the amplitude of LER seems to increase with height. As shown in FIG. 8B(c), scatter plot shows prominent trajectories which can be an indication of a systematic behavior. Also, FIG. 8B(c) also illustrates that a correlation coefficient between the top and bottom LER can be calculated, and in this example, is 0.74. The frequency content shown in FIG. 8B(d) is quite similar between the top LER and the bottom LER (i.e., there is not a pronounced periodicity in one of the top LER or bottom LER).

Figure 9:
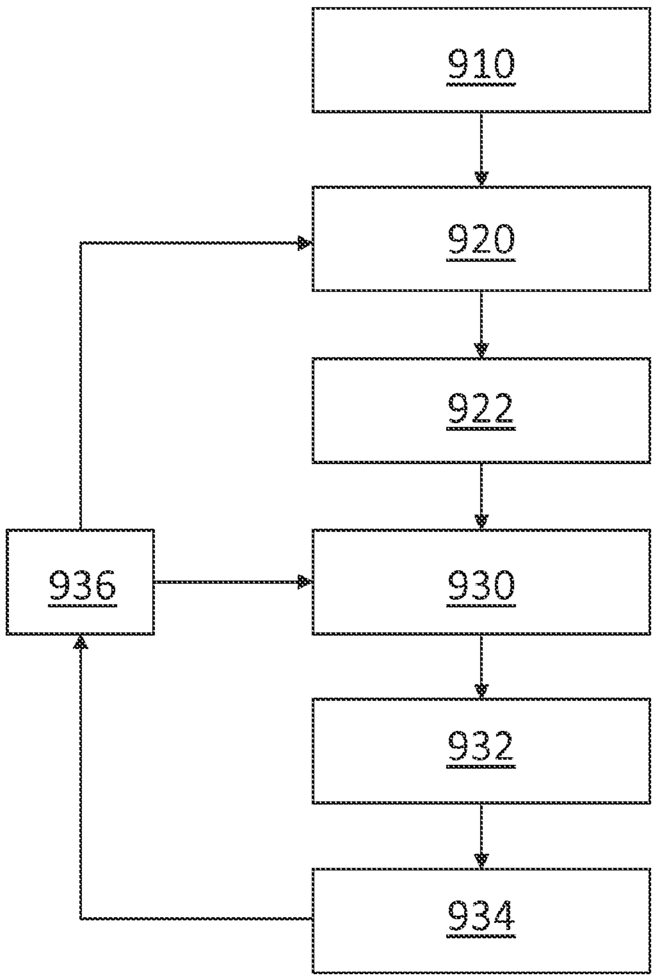
FIG. 9 illustrates an exemplary flow chart for a process model incorporating determined three-dimensional features, according to some embodiments of the present disclosure.

FIG. 9 illustrates an exemplary flow chart for a process model incorporating determined three-dimensional features, according to some embodiments of the present disclosure.

Some embodiments of process model 910 can include, bottom optical model 920 that simulates the light impinging on a photoresist. Bottom optical model 920 can also generate parameters 922 that can be input to resist model 930. Resist model 930 can generate the effects of the simulated light pattern on the photoresist, and optionally include a threshold adjustment 932 that sets a required amount of light required to develop a photoresist. The parameters that control the output of resist model 930 can be optimized by a parameter optimization module 936. Parameter optimization module 936 can output optimized parameters to either or both of bottom optical model 920 and resist model 930.

In some embodiments, process model 910 can be improved by, at 934, calibrating a resist model based on the height map and a predicted resist profile generated by the resist model. This is shown in FIG. 9 by the output of the optimized resist profile being used as input to parameter optimization model 936. As used herein, "resist profile" means a two or three dimensional description of a photoresist that can be used in the patterning process. The predicted resist profile can be generated by calculating the predicted resist profile based on parameters of the resist model.

Calibration of the resist model can include determining updated parameters by at least minimizing a norm of a difference between the predicted resist profile and the height map. The norm can be expressed mathematically as $\|z_{resist}(p)-z_{SEM}\|$, where $z_{resist}$ can be the predicted resist profile (e.g., a height map generated by the resist model), p can be the parameters of the resist model that are updated/optimized, and $z_{SEM}$ can be the height map generated by any of the methods described herein (e.g., where the height map may be calculated from the combined image using a weighted combination of portions of the captured image and the simulated image). In this way, the parameters of the resist model can be adjusted to provide a more accurate resist model based on an accurate three-dimensional reconstruction of the printed pattern. Similarly, in an embodiment, a mask pattern can be altered when it is determined that such an alteration will significantly reduce and/or eliminate a hidden defect. Such optimizations can be viewed as a three-dimensional versions of the previously-described cost function.

Figure 10:
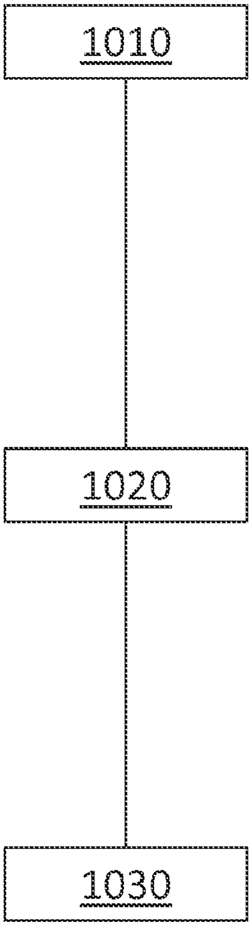
FIG. 10 is a process flow diagram illustrating a method for determining the existence of a hidden defect, according to some embodiments of the present disclosure.

FIG. 10 is a process flow diagram illustrating a method for determining the existence of a hidden defect, according to some embodiments of the present disclosure.

The method can include, at 1010, obtaining a captured image of a printed pattern with the image capture device, and a simulated image of the printed pattern generated by a lithography model.

At 1020, a combined image can be generated based on the captured image and the simulated image.

At 1030, a defect in the printed pattern can be determined based on the combined image.

Figure 11:
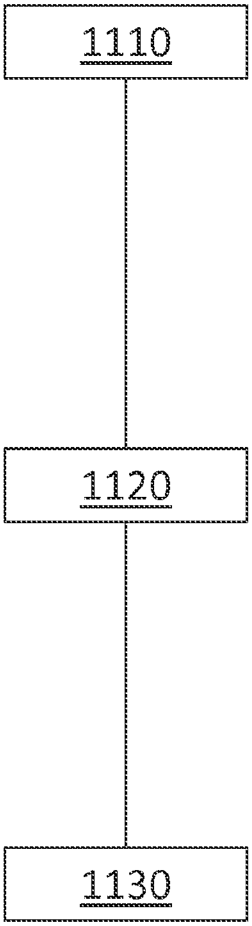
FIG. 11 is a process flow diagram illustrating a method for improving a process model for a patterning process, according to some embodiments of the present disclosure.

FIG. 11 is a process flow diagram illustrating a method for improving a process model for a patterning process, according to some embodiments of the present disclosure.

The method can include, at 1110, obtaining a captured image of a printed pattern from an image capture device, a simulated image generated by the process model, and a combined image of the captured image and the simulated image.

At 1120, three-dimensional features of the printed pattern can be determined from the combined image.

At 1130, the process model can be improved based on the determined three-dimensional features.

Figure 12:
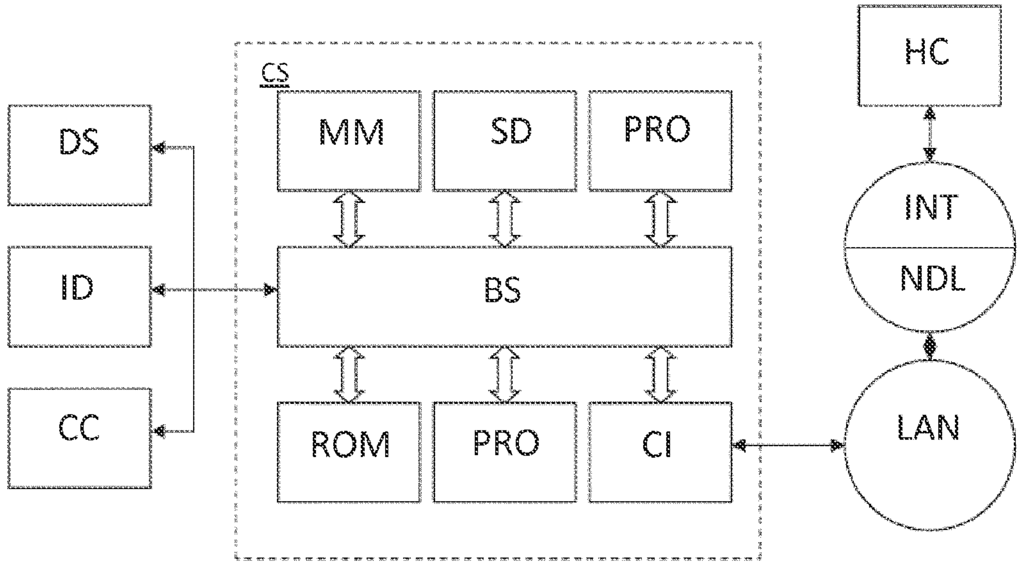
FIG. 12 is a block diagram of an example computer system, according to some embodiments of the present disclosure.

FIG. 12 is a block diagram of an example computer system CS, according to some embodiments of the present disclosure.

Computer system CS may include a bus BS or other communication mechanism for communicating information, and a processor PRO (or multiple processor) coupled with bus BS for processing information. Computer system CS may include a main memory MM, such as a random access memory (RAM) or other dynamic storage device, coupled to bus BS for storing information and instructions to be executed by processor PRO. Main memory MM may be used for storing temporary variables or other intermediate information during execution of instructions to be executed by processor PRO. Computer system CS may include a read only memory (ROM) ROM or other static storage device coupled to bus BS for storing static information and instructions for processor PRO. A storage device SD, such as a magnetic disk or optical disk, may be provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, may be coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (e.g., screen) display may also be used as an input device.

According to some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In some embodiment, hard-wired circuitry may be used in place of or in combination with software instructions. Thus, the description herein is not limited to any specific combination of hardware circuitry and software.

The term "computer-readable medium" as used herein may refer to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media may include dynamic memory, such as main memory MM. Transmission media may include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS may carry the data to main memory MM, from which processor PRO may retrieve and execute the instructions. The instructions received by main memory MM may optionally be stored on storage device SD either before or after execution by processor PRO.

Computer system CS may include a communication interface CI coupled to bus BS. Communication interface CI may provide a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 13:
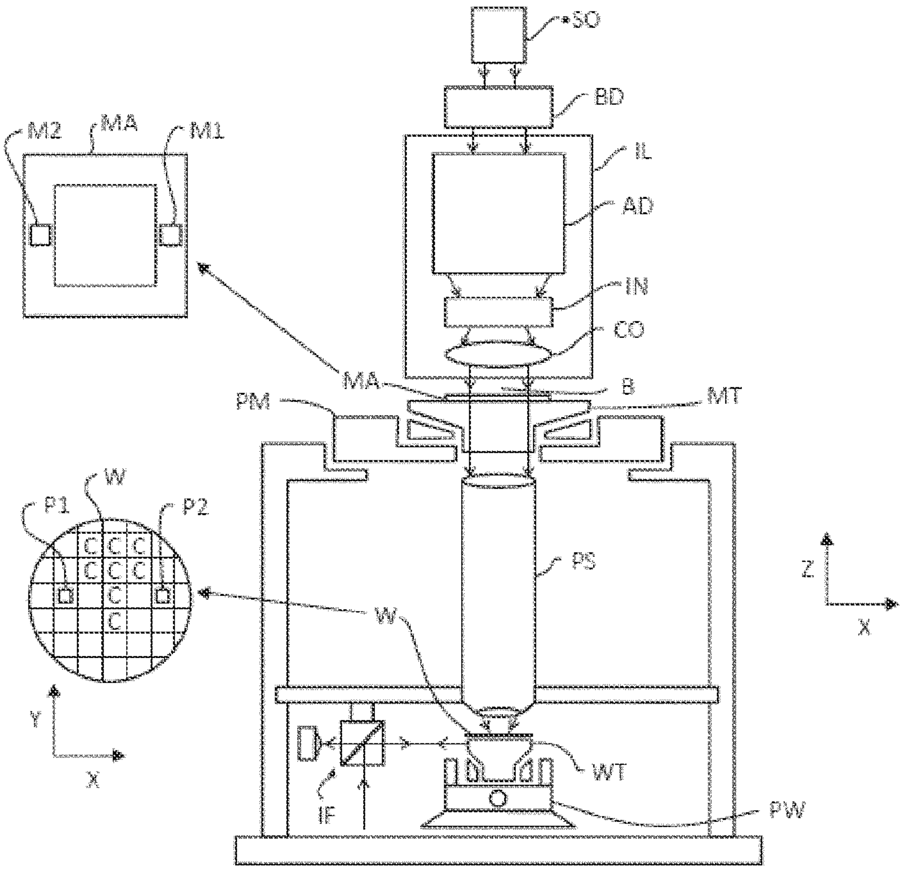
FIG. 13 is a schematic diagram of a lithographic projection apparatus, according to some embodiments of the present disclosure.

FIG. 13 is a schematic diagram of a lithographic projection apparatus, according to some embodiments of the present disclosure.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (e.g., has a transmissive patterning device). However, in general, it may also be of a reflective type, for example (e.g., with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) may produce a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent, commonly referred to as σ-outer and σ-inner, respectively, of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (e.g., as is often the case when source SO is a mercury lamp), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which may be held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, for example so as to position different target portions C in the path of beam PB. Similarly, the first positioning apparatus can be used to accurately position patterning device MA with respect to the path of beam B, for example, after mechanical retrieval of the patterning device MA from a patterning device library, or during a scan. In general, movement of the object tables MT, WT can be realized with the aid of a long-stroke module (e.g., coarse positioning) and a short-stroke module (e.g., fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT may be kept essentially stationary, and an entire patterning device image may be projected in one go (e.g., a single "flash") onto a target portion C. Substrate table WT can be shifted in the x and/or y directions so that a different target portion C can be irradiated by beam PB.

In scan mode, essentially the same scenario may apply, except that a given target portion C may not exposed in a single "flash." Instead, patterning device table MT may be movable in a given direction (the so-called "scan direction", e.g., the y direction) with a speed v, so that projection beam B is caused to scan over a patterning device image; concurrently, substrate table WT may simultaneously be moved in the same or opposite direction at a speed $V=Mv$, in which M is the magnification of the lens PL (typically, $M=1/4$ or $1/5$). In this manner, a relatively large target portion C can be exposed, without having to compromise on resolution.

Figure 14:
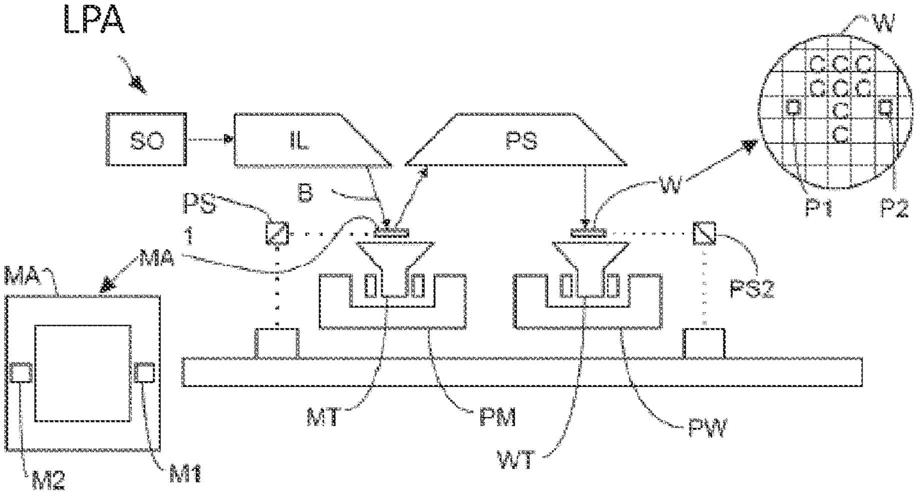
FIG. 14 is a schematic diagram of another lithographic projection apparatus, according to some embodiments of the present disclosure.

FIG. 14 is a schematic diagram of another lithographic projection apparatus (LPA), according to some embodiments.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g., a mask or a reticle) MA and connected to a first positioner PM configured to accurately position the patterning device;

Substrate table (e.g., a wafer table) WT can be constructed to hold a substrate (e.g., a resist coated wafer) W and connected to a second positioner PW configured to accurately position the substrate.

Projection system (e.g., a reflective projection system) PS can be configured to project a pattern imparted to the radiation beam B by patterning device MA onto a target portion C (e.g., comprising one or more dies) of the substrate W.

As here depicted, LPA can be of a reflective type (e.g., employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, for example, xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma may emit output radiation, for example, EUV radiation, which may collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In some cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g., mask) MA, the radiation beam B may pass through the projection system PS, which may focus the beam onto a target portion C of the substrate W. With the aid of the second positioner PW and position sensor PS2 (e.g., an interferometric device, linear encoder or capacitive sensor), the substrate table WT can be moved accurately, for example, so as to position different target portions C in the path of radiation beam B Similarly, the first positioner PM and another position sensor PS1 can be used to accurately position the patterning device (e.g., mask) MA with respect to the path of the radiation beam B. Patterning device (e.g., mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g., patterning device table) MT and the substrate table WT are kept essentially stationary, while an entire pattern imparted to the radiation beam is projected onto a target portion C at one time (e.g., a single static exposure). The substrate table WT may shifted in the X and/or Y direction so that a different target portion C can be exposed.

In scan mode, the support structure (e.g., patterning device table) MT and the substrate table WT may be scanned synchronously while a pattern imparted to the radiation beam may be projected onto target portion C (e.g., a single dynamic exposure). The velocity and direction of substrate table WT relative to the support structure (e.g., patterning device table) MT may be determined by the (de-)magnification and image reversal characteristics of the projection system PS.

In stationary mode, the support structure (e.g., patterning device table) MT may be kept essentially stationary holding a programmable patterning device, and substrate table WT may be moved or scanned while a pattern imparted to the radiation beam may be projected onto a target portion C. In this mode, generally a pulsed radiation source may be employed and the programmable patterning device may be updated as required after each movement of the substrate table WT or in between successive radiation pulses during a scan. This mode of operation can be readily applied to maskless lithography that utilizes programmable patterning device, such as a programmable mirror array of a type as referred to above.

Figure 15:
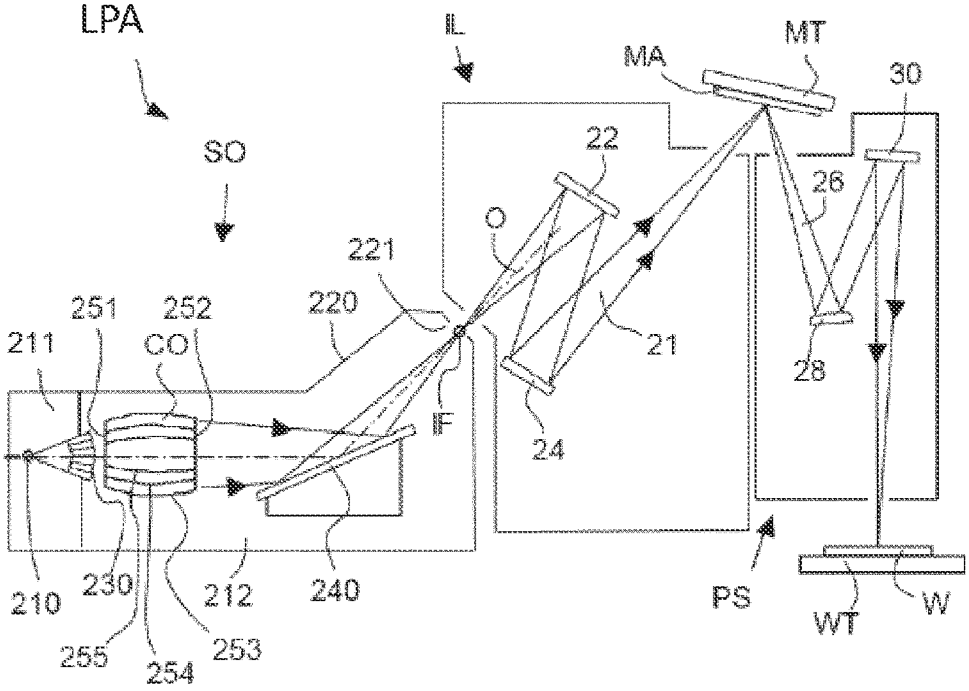
FIG. 15 is a detailed view of the lithographic projection apparatus, according to some embodiments of the present disclosure.

FIG. 15 is a detailed view of the lithographic projection apparatus, according to some embodiments of the present disclosure.

As shown, LPA can include the source collector module SO, the illumination system IL, and the projection system PS. The source collector module SO may be constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 may be created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 may be passed from a source chamber 211 into a collector chamber 212 via an optional gas barrier or contaminant trap 230 (e.g., in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein may include a channel structure, as known in the art.

The collector chamber 211 may include a radiation collector CO which may be a so-called grazing incidence collector. Radiation collector CO may have an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF can be referred to as the intermediate focus, and the source collector module can be arranged such that the intermediate focus IF is located at or near an opening 221 in the enclosing structure 220. The virtual source point IF may be an image of the radiation emitting plasma 210.

Subsequently the radiation may traverse the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 may be formed and the patterned beam 26 may be imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors 253, 254 and 255, just as an example of a collector (or collector mirror). The grazing incidence reflectors 253, 254 and 255 may be disposed axially symmetric around the optical axis O and a collector optic CO of this type may be used in combination with a discharge produced plasma source, often called a DPP source.

Figure 16:
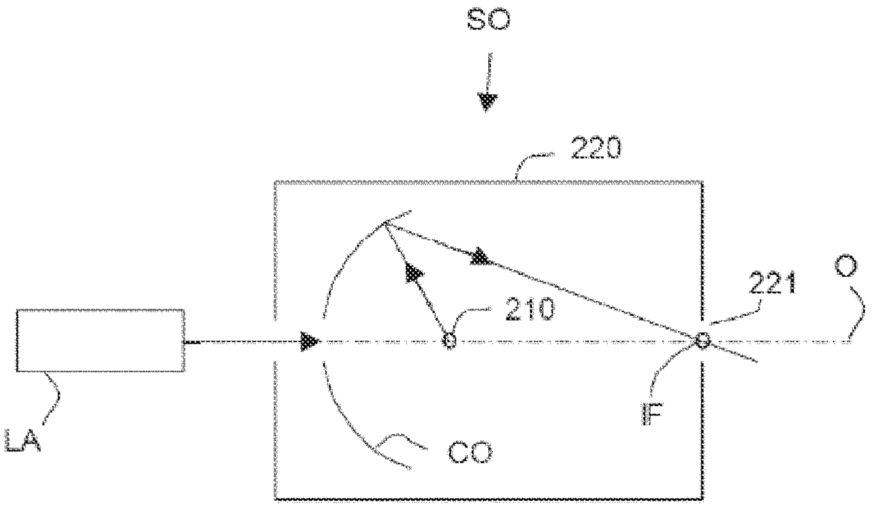
FIG. 16 is a detailed view of the source collector module of the lithographic projection apparatus, according to some embodiments of the present disclosure.

FIG. 16 is a detailed view of source collector module SO of lithographic projection apparatus LPA, according to some embodiments of the present disclosure.

Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining the existence of a defect in a printed pattern, the method comprising:
   - obtaining a) a captured image of a printed pattern from an image capture device, and b) a simulated image of the printed pattern generated by a process model;
   - generating a combined image as a weighted combination of portions of the captured image and the simulated image; and
   - determining whether a defect exists in the printed pattern based on the combined image.

2. The method of clause 1, wherein the defect is at least one of a hole closure, bridging, or necking in a portion of the printed pattern.

3. The method of any preceding clause, further comprising determining a location or height of the defect.

4. The method of any preceding clause, further comprising determining a defect characteristic of the defect.

5. The method of clause 4, the determining of the defect characteristic comprising determining a physical characteristic of the defect.

6. The method of clause 4, the determining of the defect characteristic comprising determining a magnitude of the defect.

7. The method of any preceding clause, further comprising calibrating the process model to reduce a probability of an occurrence of the defect.

8. The method of any preceding clause, wherein the process model is a probabilistic lithography model configured to generate a probability field representing a plurality of shapes of the printed pattern.

9. The method of clause 8, further comprising:
   - determining an albedo distribution of the printed pattern from the probability field; and
   - incorporating the albedo distribution into a scanning electron microscope model.

10. The method of any preceding clause, wherein the weighted combination is based on a) a noise level in the captured image and/or b) an error level in the simulated image.

11. The method of clause 10, wherein a weighting of the portions of the captured image is inversely proportional to the noise level and/or a weighting of the portions of the simulated image is inversely proportional to the error level of the simulated image.

12. The method of any preceding clause, wherein pixels in the captured image that are associated with a charging artifact are weighted less than other pixels when generating the combined image.

13. The method of any preceding clause, wherein the image capture device is at least one of a scanning electron microscope or an atomic force microscope.

14. A method for improving a process model for a patterning process, the method comprising:
   - obtaining a) a captured image of a printed pattern from an image capture device, b) a simulated image generated by the process model, and c) a combined image of the captured image and the simulated image;
   - determining three-dimensional features of the printed pattern from the combined image; and
   - improving the process model based on the determined three-dimensional features.

15. The method of clause 14, wherein the captured image is a two-dimensional image having a captured image intensity.

16. The method of clause 15, wherein the simulated image is generated by a machine-learning model and the simulated image includes a simulated image intensity which is a prediction of the captured image intensity.

17. The method of clauses 14 to 16, further comprising determining a height map based on matching the simulated image intensity to the captured image intensity, the height map including the three-dimensional features.

18. The method of clause 17, further comprising calibrating a resist model based on the height map and a predicted resist profile generated by the resist model.

19. The method of clause 18, further comprising calculating the predicted resist profile based on parameters of the resist model.

20. The method of clause 19, the calibration of the resist model comprising determining updated parameters by at least minimizing a norm of a difference between the predicted resist profile and the height map.

21. The method of clause 20, wherein the height map is calculated from the combined image using a weighted combination of portions of the captured image and the simulated image.

22. A computer program product comprising a non-transitory computer readable medium having instructions recorded thereon, the instructions when executed by a computer implementing the method of any of the above clauses.

The concepts disclosed herein may simulate or mathematically model any generic imaging system for imaging sub wavelength features, and may be especially useful with emerging imaging technologies capable of producing increasingly shorter wavelengths. Emerging technologies already in use include extreme ultra violet (EUV), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (e.g., either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, for example, those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A method for determining an existence of a defect in a printed pattern, the method comprising:

obtaining a) a captured image of a printed pattern on a semiconductor substrate from an image capture device, and b) a simulated image of the printed pattern generated by a semiconductor patterning process model;

generating a combined image as a weighted combination of portions of the captured image and the simulated image, wherein the weighted combination is based on a) a noise level or artifact in the captured image and/or b) an error level in the simulated image; and determining whether a semiconductor patterning defect exists in the printed pattern based on the combined image.

2. The method of claim 1, further comprising determining a location or height of the semiconductor patterning defect.

3. The method of claim 1, further comprising determining a defect characteristic of the semiconductor patterning defect.

4. The method of claim 3, the determining of the defect characteristic comprising determining a physical characteristic of the semiconductor patterning defect and/or the determining of the defect characteristic comprising determining a magnitude of the semiconductor patterning defect.

5. The method of claim 1, further comprising calibrating the semiconductor patterning process model to reduce a probability of an occurrence of the semiconductor patterning defect.

6. The method of claim 1, wherein the semiconductor patterning process model is a probabilistic lithography model configured to generate a probability field representing a plurality of shapes of the printed pattern.

7. The method of claim 6, further comprising:

determining an albedo distribution of the printed pattern from the probability field; and incorporating the albedo distribution into a scanning electron microscope model.

8. The method of claim 1, wherein a weighting of the portions of the captured image is inversely proportional to the noise level or artifact, and/or a weighting of the portions of the simulated image is inversely proportional to the error level of the simulated image.

9. The method of claim 1, wherein pixels in the captured image that are associated with a charging artifact are weighted less than other pixels when generating the combined image.

10. The method of claim 1, wherein the image capture device is at least one of an electron beam inspection apparatus, a scanning electron microscope, an x-ray machine, or an atomic force microscope.

11. A method for improving a semiconductor patterning process model for a patterning process, the method comprising:

obtaining a) a captured image of a printed pattern on a semiconductor substrate from an image capture device, b) a simulated image of the printed pattern generated by the semiconductor patterning process model, and c) a combined image of the captured image and the simulated image;

determining three-dimensional features of the printed pattern from the combined image; and improving the semiconductor patterning process model based on the determined three-dimensional features.

12. The method of claim 11, further comprising determining a height map based on matching a simulated image intensity of the simulated image to a captured image intensity of the captured image, the height map including the three-dimensional features.

13. The method of claim 12, further comprising calibrating a resist model based on the height map and a predicted resist profile generated by the resist model.

14. A computer program product comprising a non-transitory computer readable medium having instructions recorded thereon, the instructions when executed by a computer implementing a method comprising:

obtaining a) a captured image of a printed pattern on a semiconductor substrate from an image capture device, and b) a simulated image of the printed pattern generated by a semiconductor patterning process model;

generating a combined image as a weighted combination of portions of the captured image and the simulated image, wherein the weighted combination is based on a) a noise level in the captured image and/or b) an error level in the simulated image; and determining whether a semiconductor patterning defect exists in the printed pattern based on the combined image.

15. A computer program product comprising a non-transitory computer readable medium having instructions recorded thereon, the instructions when executed by a computer implementing a method comprising:

obtaining a) a captured image of a printed pattern on a semiconductor substrate from an image capture device, b) a simulated image of the printed pattern generated by a semiconductor patterning process model, and c) a combined image of the captured image and the simulated image;

determining three-dimensional features of the printed pattern from the combined image; and improving the semiconductor patterning process model based on the determined three-dimensional features.

* * * * *